US012568583B2

(12) United States Patent
Otsubo et al.

(10) Patent No.: US 12,568,583 B2
(45) Date of Patent: Mar. 3, 2026

(54) CIRCUIT MODULE

(71) Applicant: Murata Manufacturing Co., Ltd.,
Nagaokakyo (JP)

(72) Inventors: Yoshihito Otsubo, Nagaokakyo (JP);
Hideo Nakagoshi, Nagaokakyo (JP);
Hiroki Yoshimori, Nagaokakyo (JP)

(73) Assignee: **MURATA MANUFACTURING CO.,
LTD.**, Kyoto-Fu (JP)

( * ) Notice: Subject to any disclaimer, the term of this
patent is extended or adjusted under 35
U.S.C. 154(b) by 204 days.

(21) Appl. No.: 18/483,929

(22) Filed: Oct. 10, 2023

(65) Prior Publication Data

US 2024/0138066 A1 Apr. 25, 2024
US 2024/0237211 A9 Jul. 11, 2024

(30) Foreign Application Priority Data

Oct. 19, 2022 (JP) ................................. 2022-167402

(51) Int. Cl.
*H05K 1/14* (2006.01)
*H05K 1/02* (2006.01)
(52) U.S. Cl.
CPC ........... *H05K 1/144* (2013.01); *H05K 1/0203*
(2013.01); *H05K 2201/0379* (2013.01); *H05K*
*2201/10507* (2013.01); *H05K 2201/10977*
(2013.01)

(58) Field of Classification Search
CPC ................. H05K 1/144; H05K 1/0203; H05K
2201/0379; H05K 2201/10507
USPC ......................................................... 174/260
See application file for complete search history.

(56) References Cited

U.S. PATENT DOCUMENTS 9,502,390 B2 * 11/2016 Caskey .................... H05K 3/46
11,044,808 B2 * 6/2021 Yoon .................... H05K 1/0271
11,133,244 B2 9/2021 Yeh

FOREIGN PATENT DOCUMENTS

JP 6282589 B2 2/2018

* cited by examiner

*Primary Examiner* — Andargie M Aychillhum
(74) *Attorney, Agent, or Firm* — McDonald Hopkins LLC

(57) ABSTRACT

An upper circuit board body has a first upper main surface
and a first lower main surface. A lower circuit board body
has a second upper main surface and a second lower main
surface. A lower circuit board first mounting electrode and
one or more lower circuit board second mounting electrodes
are disposed on the second upper main surface. A first
component is mounted on the one or more lower circuit
board second mounting electrodes. A first conductor mem-
ber is mounted on the lower circuit board first mounting
electrode and is disposed on the left of the first component.
A second conductor member is disposed on the first lower
main surface, is connected to the upper end of the first
conductor member, and overlaps at least a part of the first
component as viewed in the downward direction.

16 Claims, 8 Drawing Sheets

FIG. 5

CIRCUIT MODULE

CROSS REFERENCE TO RELATED APPLICATION

This application claims priority from Japanese Patent Application No. 2022-167402 filed on Oct. 19, 2022. The content of this application is incorporated herein by reference in its entirety.

BACKGROUND OF THE DISCLOSURE

1. Field of the Disclosure

The present disclosure relates to an electronic device including an upper circuit board and a lower circuit board.

2. Description of the Related Art

As a disclosure related to a conventional circuit module, for example, a semiconductor device package described in U.S. Pat. No. 11,133,244 is known. This composite substrate includes a first substrate, a second substrate, and a conductive structure. The first substrate is disposed on the second substrate. The conductive structure is a pin extending along an up-down axis. The conductive structure is mounted on a lower main surface of the first substrate and an upper main surface of the second substrate. Due to this, the conductive structure electrically connects the first substrate and the second substrate.

BRIEF SUMMARY OF THE DISCLOSURE

Regarding the semiconductor device package described in U.S. Pat. No. 11,133,244, there is a demand for suppressing heat generated by a component disposed between the first substrate and the second substrate from being transferred to the periphery of the component.

A possible benefit of the present disclosure is to provide a circuit module capable of suppressing heat generated by a component disposed between an upper circuit board and a lower circuit board from being transferred to the periphery of the component.

A circuit module according to an embodiment of the present disclosure includes: an upper circuit board, a lower circuit board, a first conductor member, a second conductor member, and a first component, in which the upper circuit board includes an upper circuit board body, the lower circuit board includes a lower circuit board body, a lower circuit board first mounting electrode, and one or more lower circuit board second mounting electrodes, the upper circuit board body has a first upper main surface and a first lower main surface, the lower circuit board body has a second upper main surface and a second lower main surface, the lower circuit board first mounting electrode and the one or more lower circuit board second mounting electrodes are disposed on the second upper main surface, the first component is mounted on the one or more lower circuit board second mounting electrodes, the first conductor member is mounted on the lower circuit board first mounting electrode and is disposed on left of the first component, and the second conductor member is disposed in a space between the upper circuit board and the lower circuit board or on the first lower main surface, is connected to an upper end of the first conductor member, and overlaps at least a part of the first component as viewed in a downward direction.

According to the circuit module according to the present disclosure, heat dissipation of a component disposed between the upper circuit board and the lower circuit board can be improved.

BRIEF DESCRIPTION OF THE SEVERAL VIEWS OF THE DRAWINGS

FIG. 2 is a cross-sectional view of a circuit module 10a;
FIG. 5 is a cross-sectional view of a circuit module 10d.

DETAILED DESCRIPTION OF THE DISCLOSURE

Embodiments

[Structure of Circuit Module 10]

Figure 1:
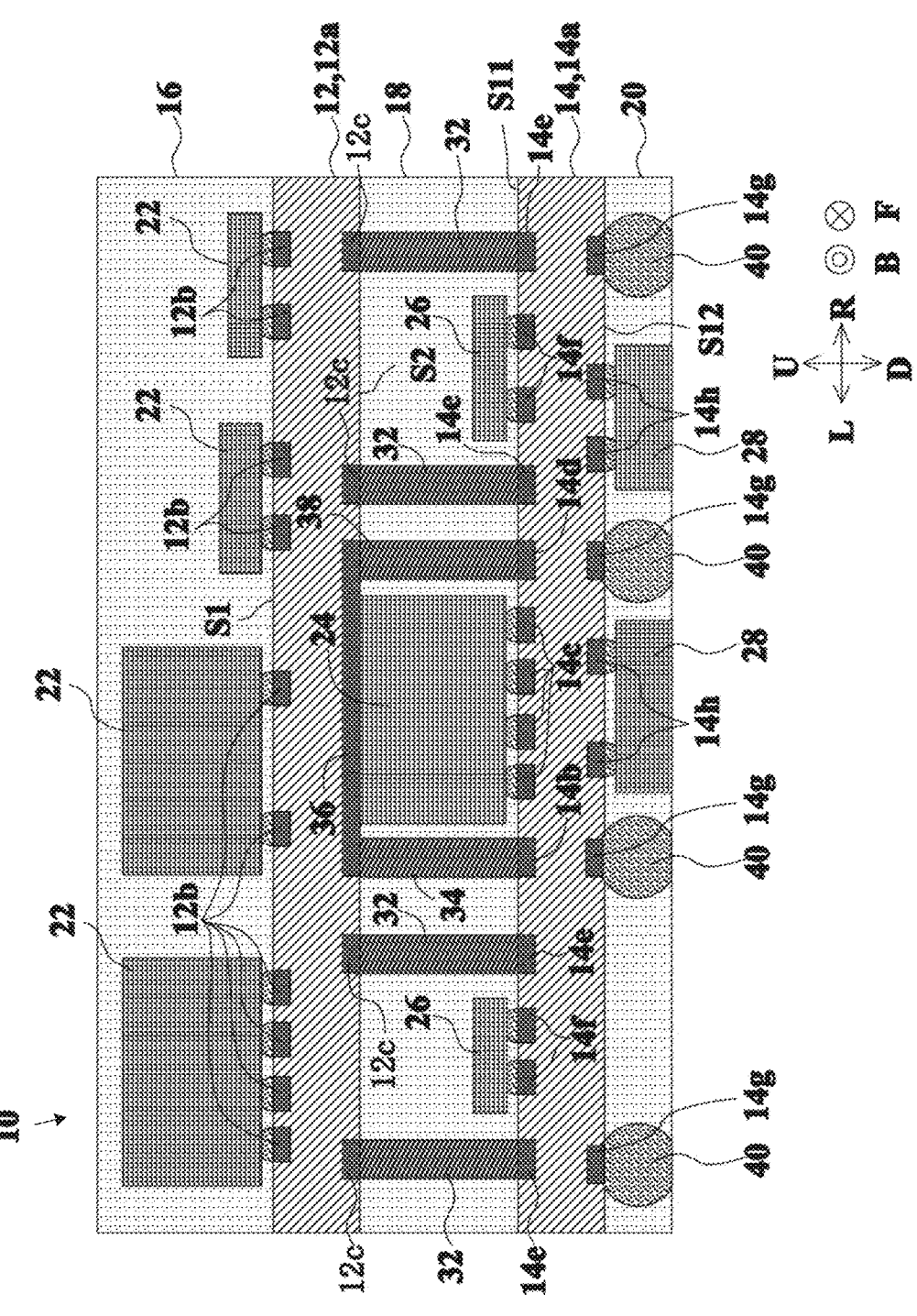
FIG. 1 is a cross-sectional view of a circuit module 10.

The structure of the circuit module 10 according to a first embodiment of the present disclosure will be described below with reference to the drawings. FIG. 1 is a cross-sectional view of a circuit module 10.

Hereinafter, as illustrated in FIG. 1, a direction from an upper circuit board 12 toward a lower circuit board 14 is defined as a downward direction of an up-down axis that coincides with an up-down direction. Axes orthogonal to the up-down axis are defined as a front-back axis and a left-right axis. The up-down axis, the front-back axis, and the left-right axis are orthogonal to one another. The front-back axis coincides with an axis extending along an axis perpendicular to the drawing sheet surface of FIG. 1. The left-right axis coincides with the left-right axis of the drawing sheet surface of FIG. 1. However, the up-down axis, the left-right axis, and the front-back axis in the present specification are directions defined for convenience of description, and need not coincide with the up-down axis, the left-right axis, and the front-back axis in use of the circuit module 10. In each drawing, the upward direction and the downward direction may be interchanged, the left direction and the right direction may be interchanged, and the front direction and the back direction may be interchanged.

The circuit module 10 is used for a wireless communication terminal such as a smartphone. The circuit module 10 includes, for example, an integrated circuit (IC) such as a power amplifier (PA) or a low noise amplifier (LNA), and a coil, a capacitor, and the like. The coil, the capacitor, and the like are impedance matching circuit elements for each IC. The circuit module 10 has a cuboid shape. As illustrated in FIG. 1, the circuit module 10 includes the upper circuit board 12, the lower circuit board 14, a sealing resin 16, a sealing resin 18, a sealing resin 20, a plurality of components 22, a first component 24, a plurality of components 26, a plurality of components 28, a plurality of fifth conductor members 32, a first conductor member 34, a second conductor member 36, a third conductor member 38, and a plurality of fourth conductor members 40.

The upper circuit board 12 includes an upper circuit board body 12a, a plurality of upper circuit board mounting electrodes 12b, and a plurality of upper circuit board first mounting electrodes 12c. The upper circuit board body 12a has a plate shape having a first upper main surface S1 and a first lower main surface S2. The upper circuit board body 12a has a rectangular shape having two sides along the front-back axis and two sides extending along the left-right axis as viewed in the downward direction. The upper circuit board body 12a has a multilayer structure. An electric circuit not illustrated is provided inside the upper circuit board body 12a. The material of the upper circuit board body 12a is, for example, a glass epoxy or a low temperature co-fired ceramics (LTCC) board, or the like.

As illustrated in FIG. 1, the plurality of upper circuit board mounting electrodes 12b are disposed on the first upper main surface S1 of the upper circuit board body 12a. The plurality of upper circuit board first mounting electrodes 12c are disposed on the first lower main surface S2. The plurality of upper circuit board mounting electrodes 12b and the plurality of upper circuit board first mounting electrodes 12c have a rectangular shape or a circular shape as viewed in the downward direction. The plurality of upper circuit board mounting electrodes 12b and the plurality of upper circuit board first mounting electrodes 12c have a structure in which, for example, Ni plating and Au plating are applied to the surface of a copper-thick film electrode.

The lower circuit board 14 includes a lower circuit board body 14a, a lower circuit board first mounting electrode 14b, a plurality of lower circuit board second mounting electrodes 14c, a lower circuit board third mounting electrode 14d, a plurality of lower circuit board fifth mounting electrodes 14e, a plurality of lower circuit board mounting electrodes 14f, a plurality of lower circuit board fourth mounting electrodes 14g, and a plurality of lower circuit board mounting electrodes 14h. The lower circuit board body 14a has a plate shape having a second upper main surface S11 and a second lower main surface S12. The lower circuit board body 14a has a rectangular shape having two sides extending along the front-back axis and two sides extending along the left-right axis as viewed in the downward direction. The lower circuit board body 14a has a multilayer structure. An electric circuit not illustrated is provided inside the lower circuit board body 14a. The material of the lower circuit board body 14a is, for example, a glass epoxy or an LTCC board, or the like.

As illustrated in FIG. 1, the lower circuit board first mounting electrode 14b, the plurality of lower circuit board second mounting electrodes 14c, the lower circuit board third mounting electrode 14d, the plurality of lower circuit board fifth mounting electrodes 14e, and the plurality of lower circuit board mounting electrodes 14f are disposed on the second upper main surface S11. The plurality of lower circuit board fourth mounting electrodes 14g and the plurality of lower circuit board mounting electrodes 14h are disposed on the second lower main surface S12. The lower circuit board first mounting electrode 14b, the plurality of lower circuit board second mounting electrodes 14c, the lower circuit board third mounting electrode 14d, the plurality of lower circuit board fifth mounting electrodes 14e, the plurality of lower circuit board mounting electrodes 14f, the plurality of lower circuit board fourth mounting electrodes 14g, and the plurality of lower circuit board mounting electrodes 14h have a rectangular shape or a circular shape as viewed in the up-down direction. The lower circuit board first mounting electrode 14b, the plurality of lower circuit board second mounting electrodes 14c, the lower circuit board third mounting electrode 14d, the plurality of lower circuit board fifth mounting electrodes 14e, the plurality of lower circuit board mounting electrodes 14f, the plurality of lower circuit board fourth mounting electrodes 14g, and the plurality of lower circuit board mounting electrodes 14h have a structure in which, for example, Ni plating and Au plating are applied to the surface of a copper thin film.

As illustrated in FIG. 1, the lower circuit board 14 as described above is disposed below the upper circuit board 12. The lower circuit board 14 overlaps the upper circuit board 12 as viewed in the downward direction. As viewed in the downward direction, the entire outer edge of the lower circuit board 14 overlaps the entire outer edge of the upper circuit board 12.

The plurality of components 22 are mounted on the plurality of upper circuit board mounting electrodes 12b. The plurality of components 22 are electronic components such as low noise amplification (LNA), chip coils, chip capacitors, and semiconductor integrated circuits.

The first component 24 is mounted on the plurality of lower circuit board second mounting electrodes 14c. The first component 24 is an electronic component that generates heat during driving. The heat generation amount of the first component 24 is larger than the heat generation amount of the plurality of components 26. Such an electronic component is, for example, power amplification (PA), a switch integrated circuit (IC), a duplexer, or an inductor.

The plurality of components 26 are mounted on the plurality of lower circuit board mounting electrodes 12f. The plurality of components 26 are electronic components such as chip coils, chip capacitors, and semiconductor integrated circuits.

The plurality of components 28 are mounted on the plurality of lower circuit board mounting electrodes 12h. The plurality of components 28 are electronic components such as chip coils, chip capacitors, and semiconductor integrated circuits.

The first conductor member 34 is a metal pin. The first conductor member 34 has a rod shape extending along the up-down axis. The first conductor member 34 is mounted on the lower circuit board first mounting electrode 14b. The first conductor member 34 is disposed on the left of the first component 24. The material of the first conductor member 34 is, for example, copper.

The third conductor member 38 is a metal pin. The third conductor member 38 has a rod shape extending along the up-down axis. The third conductor member 38 is mounted on the lower circuit board third mounting electrode 14d. The third conductor member 38 is disposed on the right of the first component 24. The material of the third conductor member 38 is, for example, copper.

The second conductor member 36 is disposed in a space between the upper circuit board 12 and the lower circuit board 14 or on the first lower main surface S2. In the present embodiment, the second conductor member 36 is a conductor layer disposed on the first lower main surface S2. The second conductor member 36 has a structure in which, for example, Ni plating and Au plating are applied to the surface of a copper thin film. Therefore, the thermal conductivity of the second conductor member 36 is higher than the thermal conductivity of the upper circuit board body 12a.

The second conductor member 36 is connected to the upper end of the first conductor member 34 and the upper end of the third conductor member 38. The second conductor member 36 is disposed upper than the first component 24. The second conductor member 36 overlaps at least a part of the first component 24 as viewed in the downward direction. In the present embodiment, the second conductor member 36 overlaps the entire first component 24 as viewed in the downward direction. Furthermore, the second conductor member 36 is in contact with the first component 24. The second conductor member 36 as described above is connected to ground potential. The second conductor member 36 may have floating potential that is not connected to specific potential.

The plurality of fifth conductor members 32 are metal pins. The plurality of fifth conductor members 32 have a rod shape extending along the up-down axis. The plurality of fifth conductor members 32 are mounted on the upper circuit board first mounting electrode 12c and the lower circuit board fifth mounting electrode 14e. The material of the plurality of fifth conductor members 32 is, for example, copper.

The plurality of fourth conductor members 40 are solder bumps. The plurality of fourth conductor members 40 have a spherical shape. The spherical shape in the present specification includes a spherical shape and an elliptical spherical shape. The plurality of fourth conductor members 40 are mounted on the lower circuit board fourth mounting electrode 14g. The material of the plurality of fourth conductor members 40 is, for example, solder.

As illustrated in FIG. 1, the sealing resin 18 covers the first lower main surface S2 of the upper circuit board body 12a and the second upper main surface S11 of the lower circuit board body 14a. The sealing resin 18 is disposed between the upper circuit board 12 and the lower circuit board 14 so as to cover the first component 24, the plurality of components 26, the first conductor member 34, the third conductor member 38, and the plurality of fifth conductor members 32. Therefore, the first component 24, the plurality of components 26, the first conductor member 34, the third conductor member 38, and the plurality of fifth conductor members 32 are disposed in the sealing resin 18. The sealing resin 18 has a cuboid shape. As viewed in the downward direction, the entire outer edge of the sealing resin 18 overlaps the entire outer edge of the upper circuit board 12 and the entire outer edge of the lower circuit board 14.

As illustrated in FIG. 1, the sealing resin 16 covers the first upper main surface S1 of the upper circuit board body 12a. The sealing resin 16 covers the plurality of components 22. Therefore, the plurality of components 22 are disposed in the sealing resin 16. The sealing resin 16 has a cuboid shape. As viewed in the up-down direction, the entire outer edge of the sealing resin 16 overlaps the entire outer edge of the upper circuit board 12 and the entire outer edge of the lower circuit board 14.

As illustrated in FIG. 1, the sealing resin 20 covers the second lower main surface S12 of the lower circuit board body 14a. The sealing resin 20 covers the surfaces of the plurality of fourth conductor members 40 and the plurality of components 28. However, the lower ends of the plurality of fourth conductor members 40 and the lower surfaces of the plurality of components 28 are exposed from the sealing resin 20. Therefore, the plurality of fourth conductor members 40 and the plurality of components 28 are disposed in the sealing resin 20. The sealing resin 20 has a cuboid shape. As viewed in the up-down direction, the entire outer edge of the sealing resin 20 overlaps the entire outer edge of the upper circuit board 12 and the entire outer edge of the lower circuit board 14. The materials of the sealing resin 18, the sealing resin 16, and the sealing resin 20 as described above are, for example, epoxy resins.

Effects

According to the circuit module 10, the heat generated by the first component 24 disposed between the upper circuit board 12 and the lower circuit board 14 can be suppressed from being transferred to the periphery of the first component 24. More specifically, the second conductor member 36 is disposed in a space between the upper circuit board body 12a and the lower circuit board body 14a or on the first lower main surface S2. The second conductor member 36 is connected to the upper end of the first conductor member 34. The second conductor member 36 overlaps at least a part of the first component 24 as viewed in the downward direction. Due to this, the heat generated by the first component 24 is transferred to the lower circuit board body 14a via the second conductor member 36 and the first conductor member 34. Then, the heat generated by the first component 24 is diffused to the lower circuit board body 14a. As a result, according to the circuit module 10, the heat generated by the first component 24 disposed between the upper circuit board 12 and the lower circuit board 14 can be suppressed from being transferred to the periphery of the first component 24.

According to the circuit module 10, the heat generated by the first component 24 disposed between the upper circuit board 12 and the lower circuit board 14 can be suppressed from being transferred to the periphery of the first component 24 also for the following reason. More specifically, the second conductor member 36 is in contact with the first component 24. Due to this, the heat generated by the first component 24 is efficiently transferred to the second conductor member 36. As a result, according to the circuit module 10, the heat generated by the first component 24 disposed between the upper circuit board 12 and the lower circuit board 14 can be effectively suppressed from being transferred to the periphery of the first component 24.

According to the circuit module 10, the heat generated by the first component 24 disposed between the upper circuit board 12 and the lower circuit board 14 can be suppressed from being transferred to the periphery of the first component 24 also for the following reason. The second conductor member 36 is connected to the upper end of the third conductor member 38. Due to this, the heat generated by the first component 24 is transferred to the lower circuit board body 14a via the second conductor member 36 and the third conductor member 38. Then, the heat generated by the first component 24 is diffused to the lower circuit board body 14a. As a result, according to the circuit module 10, the heat generated by the first component 24 disposed between the upper circuit board 12 and the lower circuit board 14 can be effectively suppressed from being transferred to the periphery of the first component 24.

According to the circuit module 10, the heat generated by the first component 24 disposed between the upper circuit board 12 and the lower circuit board 14 can be suppressed from being transferred to the periphery of the first component 24 also for the following reason. The second conductor member 36 is in contact with the first component 24. Due to this, the heat generated by the first component 24 is transferred to the upper circuit board body 12a via the second conductor member 36. Then, the heat generated by the first component 24 is diffused to the upper circuit board body 12a. As a result, according to the circuit module 10, the heat generated by the first component 24 disposed between the upper circuit board 12 and the lower circuit board 14 can be effectively suppressed from being transferred to the periphery of the first component 24.

(First Modification)

Figure 2:
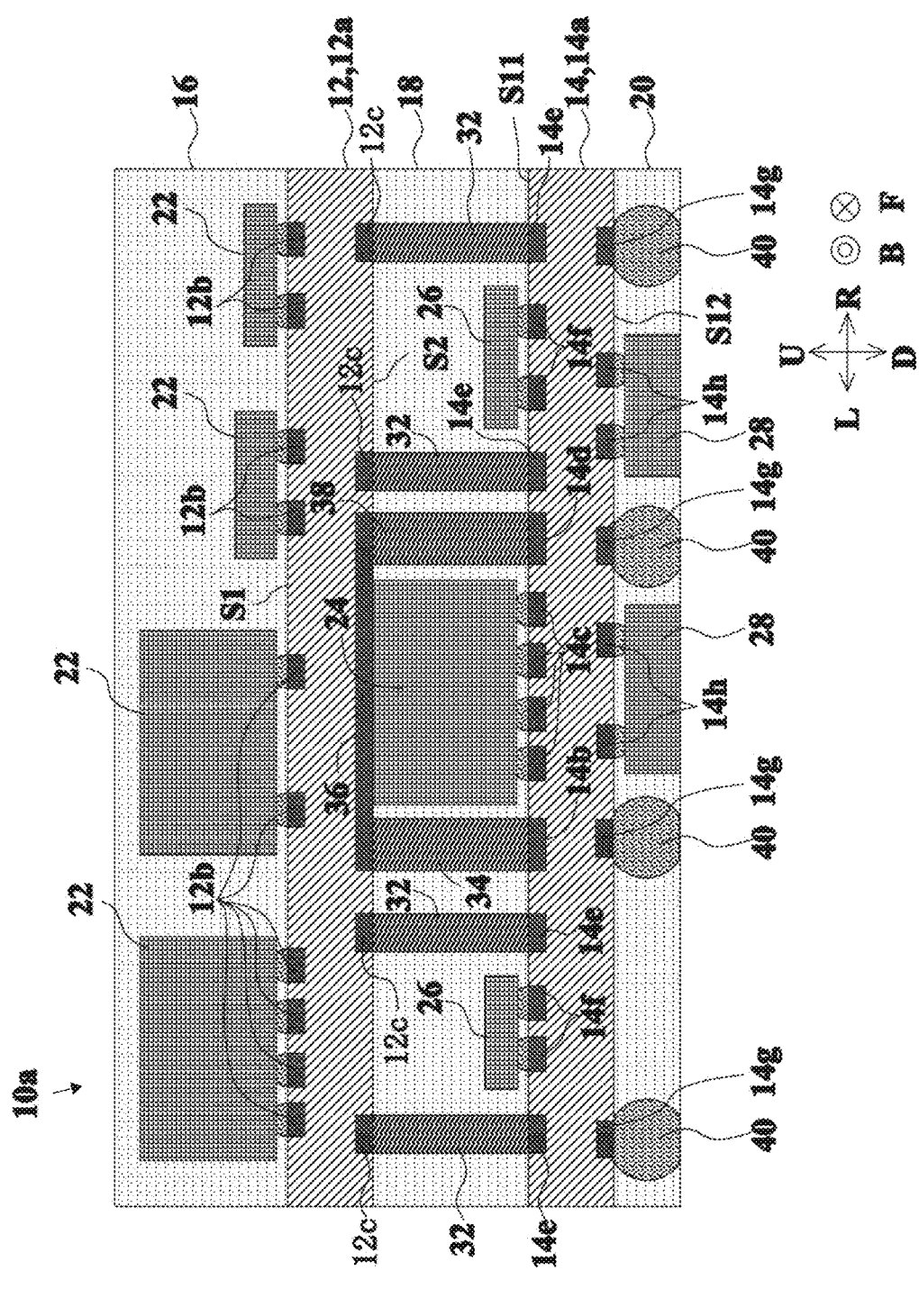

Hereinafter, the circuit module 10a according to a first modification will be described with reference to the drawings. FIG. 2 is a cross-sectional view of a circuit module 10a.

The circuit module 10a is different from the circuit module 10 in that the first conductor member 34 and the third conductor member 38 are thick. More specifically, the first conductor member 34 and the third conductor member 38 are thicker than the fifth conductor member 32. That is, the areas of the first conductor member 34 and the third conductor member 38 as viewed in the downward direction are larger than the area of the fifth conductor member 32 as viewed in the downward direction. Due to this, the heat generated by the first component 24 is efficiently transferred to the lower circuit board body 14*a* via the second conductor member 36 and the first conductor member 34. The heat generated by the first component 24 is efficiently transferred to the lower circuit board body 14*a* via the second conductor member 36 and the third conductor member 38. As a result, according to the circuit module 10*a*, the heat generated by the first component 24 disposed between the upper circuit board 12 and the lower circuit board 14 can be efficiently suppressed from being transferred to the periphery of the first component 24. The other structures of the circuit module 10*a* are the same as those of the circuit module 10, and thus description will be omitted. The circuit module 10*a* has the same functions and effects as those of the circuit module 10.

(Second Modification)

Figure 3:
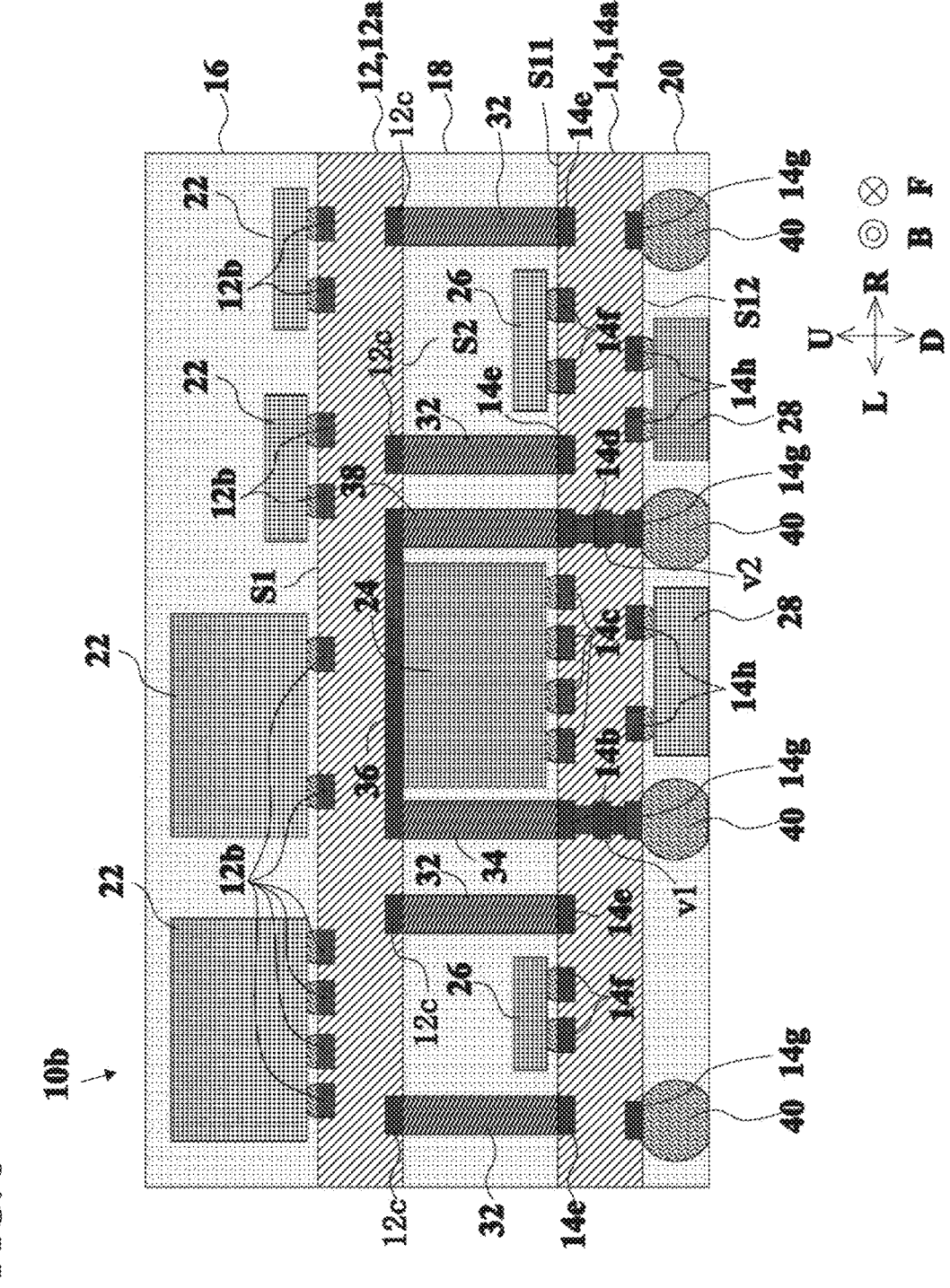
FIG. 3 is a cross-sectional view of a circuit module 10b.

Hereinafter, the circuit module 10*b* according to a second modification will be described with reference to the drawings. FIG. 3 is a cross-sectional view of a circuit module 10*b*.

The circuit module 10*b* is different from the circuit module 10 in that the lower circuit board 14 further includes interlayer connection conductors v1 and v2. By penetrating the lower circuit board body 14*a* along the up-down axis, the interlayer connection conductor v1 electrically connects the lower circuit board first mounting electrode 14*b* and the lower circuit board fourth mounting electrode 14*g*. By penetrating the lower circuit board body 14*a* along the up-down axis, the interlayer connection conductor v2 electrically connects the lower circuit board third mounting electrode 14*d* and the lower circuit board fourth mounting electrode 14*g*. The other structures of the circuit module 10*b* are the same as those of the circuit module 10, and thus description will be omitted. The circuit module 10*b* has the same functions and effects as those of the circuit module 10.

The heat generated by the first component 24 is efficiently transferred to the lower circuit board body 14*a* via the second conductor member 36, the first conductor member 34, and the interlayer connection conductor v1. The heat generated by the first component 24 is efficiently transferred to the lower circuit board body 14*a* via the second conductor member 36, the third conductor member 38, and the interlayer connection conductor v2. As a result, according to the circuit module 10*b*, the heat generated by the first component 24 disposed between the upper circuit board 12 and the lower circuit board 14 can be efficiently suppressed from being transferred to the periphery of the first component 24.

Furthermore, the heat generated by the first component 24 is transferred to the outside of the circuit module 10*b* via the interlayer connection conductor v1 and the fourth conductor member 40. The heat generated by the first component 24 is transferred to the outside of the circuit module 10*b* via the interlayer connection conductor v2 and the fourth conductor member 40. The heat generated by the first component 24 is diffused to a mother board to which, for example, the fourth conductor member 40 is connected. As a result, according to the circuit module 10*b*, the heat generated by the first component 24 disposed between the upper circuit board 12 and the lower circuit board 14 can be efficiently suppressed from being transferred to the periphery of the first component 24.

(Third Modification)

Figure 4:
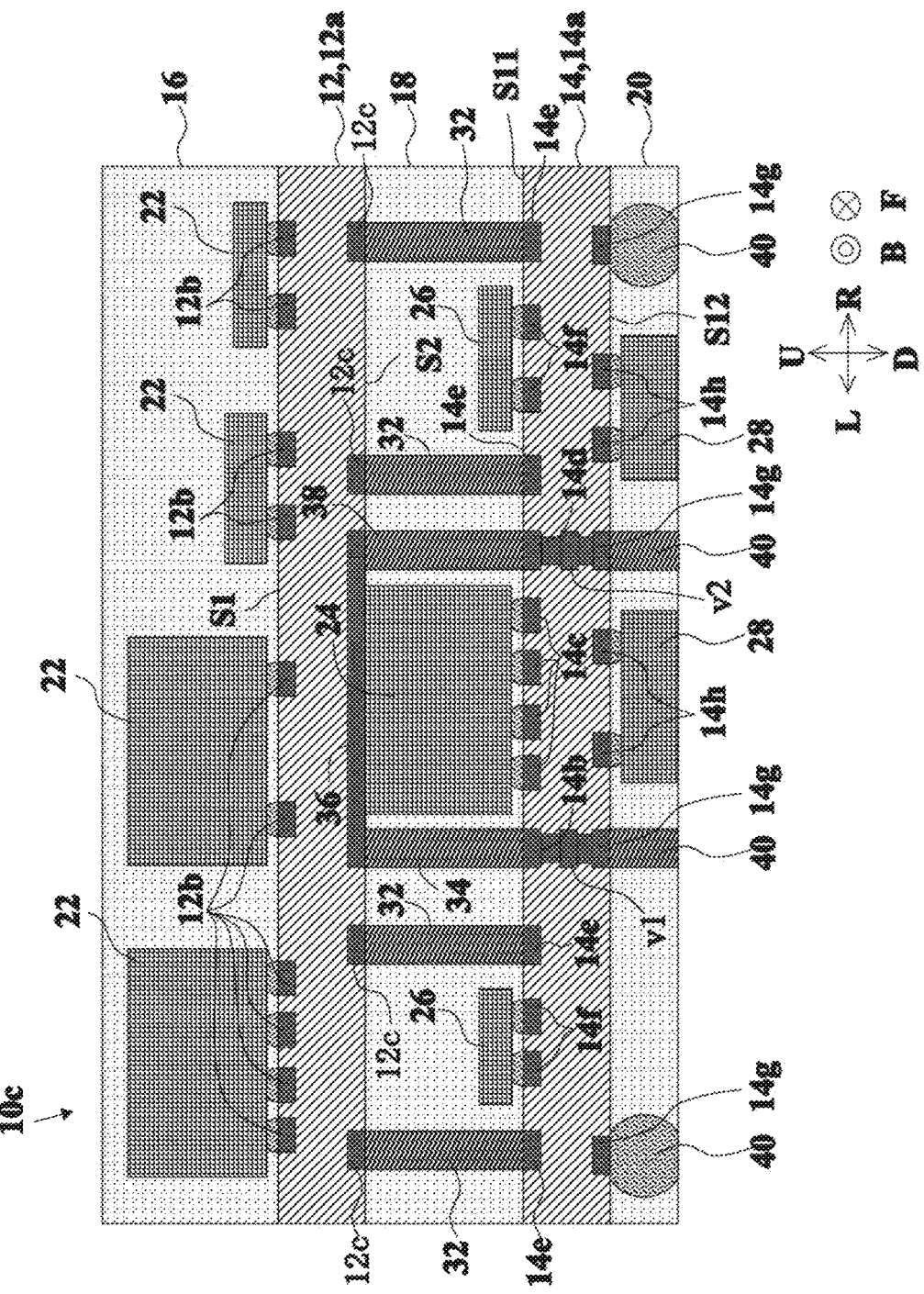
FIG. 4 is a cross-sectional view of a circuit module 10c.

Hereinafter, the circuit module 10*c* according to a third modification will be described with reference to the drawings. FIG. 4 is a cross-sectional view of a circuit module 10*c*.

The circuit module 10*c* is different from the circuit module 10*b* in that two fourth conductor members 40 connected to the interlayer connection conductors v1 and v2 are metal pins. The other structures of the circuit module 10*c* are the same as those of the circuit module 10*b*, and thus description will be omitted. The circuit module 10*c* has the same functions and effects as those of the circuit module 10*b*.

(Fourth Modification)

Figure 5:
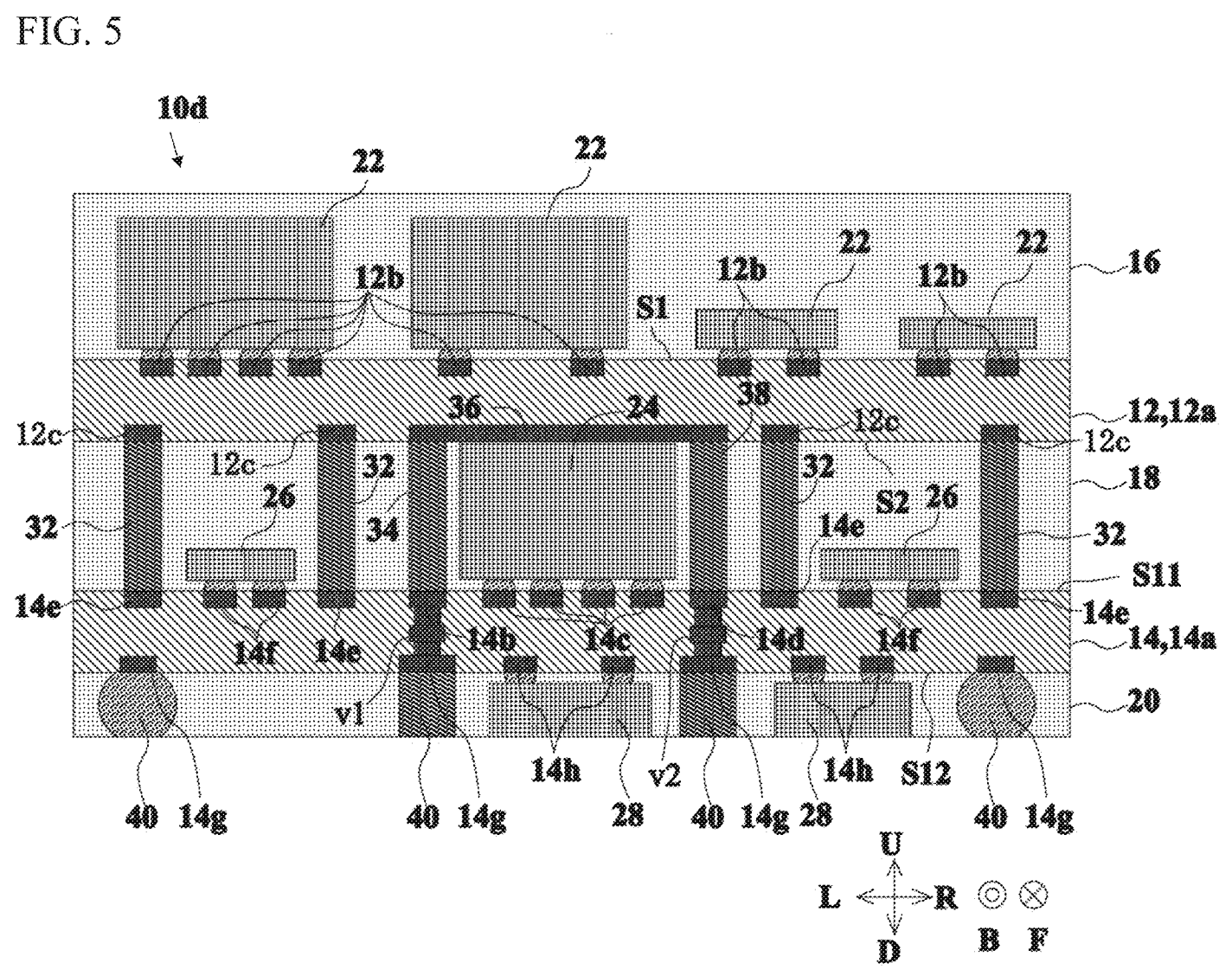

Hereinafter, the circuit module 10*d* according to a fourth modification will be described with reference to the drawings. FIG. 5 is a cross-sectional view of a circuit module 10*d*.

The circuit module 10*d* is different from the circuit module 10*c* in that the two fourth conductor members 40 connected to the interlayer connection conductors v1 and v2 are thick. More specifically, the two fourth conductor members 40 connected to the interlayer connection conductors v1 and v2 are thicker than the fifth conductor member 32. That is, the areas of the two fourth conductor members 40 viewed in the downward direction are larger than the area of the fifth conductor member 32 viewed in the downward direction. The material of the two fourth conductor members 40 is, for example, copper. Therefore, the thermal conductivity of the two fourth conductor members 40 is higher than the thermal conductivity of the solder bump. Due to this, the heat generated by the first component 24 is efficiently transferred to the outside of the circuit module 10*d* via the interlayer connection conductor v1 and the fourth conductor member 40. The heat generated by the first component 24 is efficiently transferred to the outside of the circuit module 10*d* via the interlayer connection conductor v2 and the fourth conductor member 40. As a result, according to the circuit module 10*d*, the heat generated by the first component 24 disposed between the upper circuit board 12 and the lower circuit board 14 can be efficiently suppressed from being transferred to the periphery of the first component 24.

(Fifth Modification)

Figure 6:
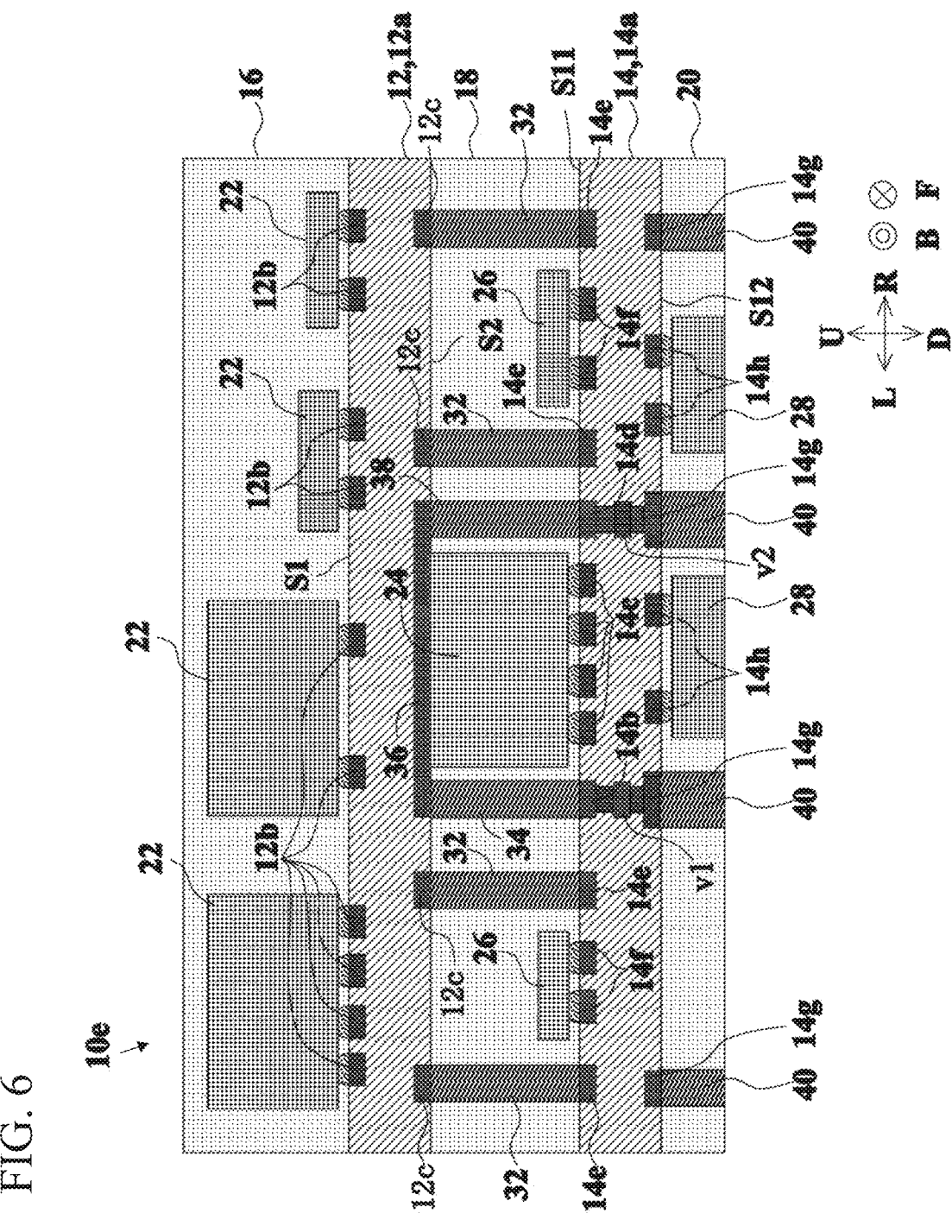
FIG. 6 is a cross-sectional view of a circuit module 10e.

Hereinafter, the circuit module 10*e* according to a fifth modification will be described with reference to the drawings. FIG. 6 is a cross-sectional view of a circuit module 10*e*.

The circuit module 10*e* is different from the circuit module 10*d* in that the two fourth conductor members 40 not connected to the interlayer connection conductors v1 and v2 are metal pins. The other structures of the circuit module 10*e* are the same as those of the circuit module 10*d*, and thus description will be omitted. The circuit module 10*e* has the same functions and effects as those of the circuit module 10*d*.

(Sixth Modification)

Figure 7:
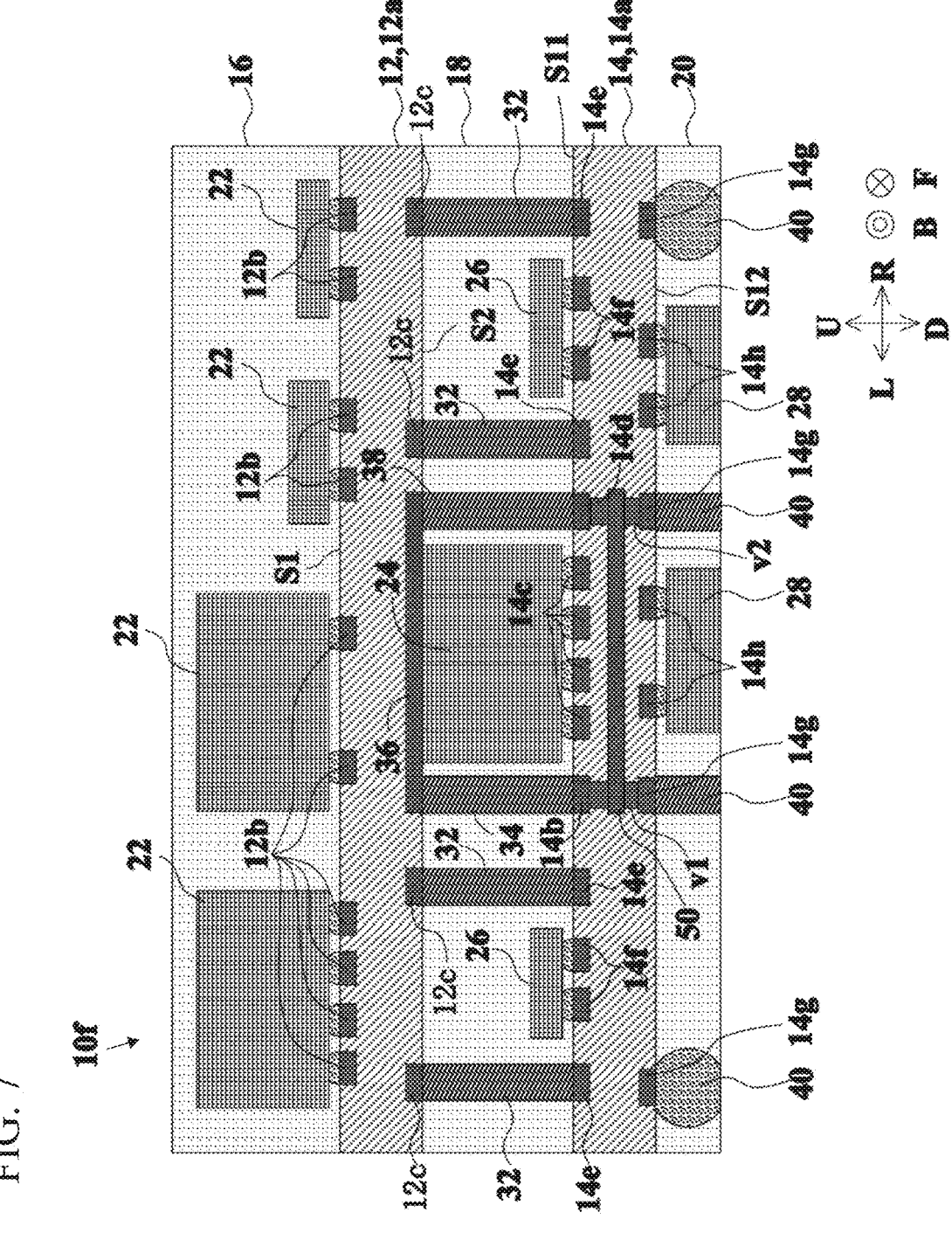
FIG. 7 is a cross-sectional view of a circuit module 10f.

Hereinafter, the circuit module 10*f* according to a sixth modification will be described with reference to the drawings. FIG. 7 is a cross-sectional view of a circuit module 10*f*.

The circuit module 10*f* is different from the circuit module 10*c* in that the lower circuit board 14 further includes a conductor layer 50. The conductor layer 50 is disposed in the lower circuit board body 14*a*. The conductor layer 50 is connected to the interlayer connection conductors v1 and v2. The other structures of the circuit module 10*f* are the same as those of the circuit module 10*c*, and thus description will be omitted. The circuit module 10f has the same functions and effects as those of the circuit module 10c.

According to the circuit module 10f, the heat generated by the first component 24 is efficiently diffused into the lower circuit board body 14a by the conductor layer 50. Furthermore, the heat generated by the first component 24 is transferred to the outside of the circuit module 10f via the interlayer connection conductor v1 and the fourth conductor member 40. The heat generated by the first component 24 is transferred to the outside of the circuit module 10f via the interlayer connection conductor v2 and the fourth conductor member 40. The heat generated by the first component 24 is diffused to a mother board to which, for example, the fourth conductor member 40 is connected. As a result, according to the circuit module 10f, the heat generated by the first component 24 disposed between the upper circuit board 12 and the lower circuit board 14 can be efficiently suppressed from being transferred to the periphery of the first component 24.

(Seventh Modification)

Figure 8:
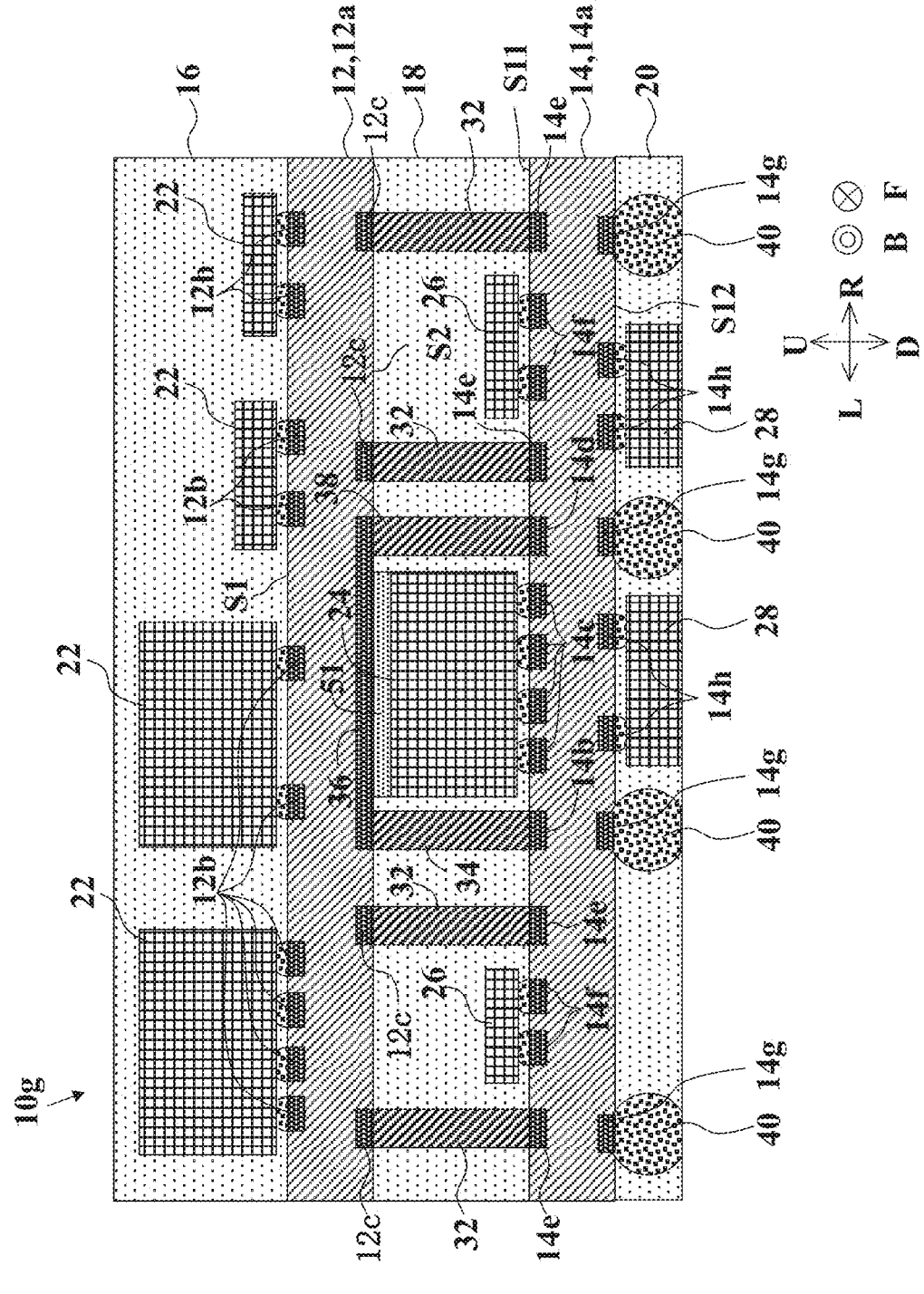
FIG. 8 is a cross-sectional view of a circuit module 10g.

Hereinafter, the circuit module 10g according to a seventh modification will be described with reference to the drawings. FIG. 8 is a cross-sectional view of the circuit module 10g.

The circuit module 10g is different from the circuit module 10 in further including a thermal interface material (TIM) layer 51. More specifically, the TIM layer 51 is disposed between the first component 24 and the second conductor member 36. The lower surface of the TIM layer 51 is in contact with the upper surface of the first component 24. The upper surface of the TIM layer 51 is in contact with the lower surface of the second conductor member 36.

The TIM layer 51 is a layer of a heat conduction material. That is, the TIM layer 51 is a layer of a material suitable for heat conduction. The material of the TIM layer 51 is non-conductive. The material of the TIM layer 51 may be, for example, an epoxy resin mixed with a metal. The metal to be mixed here may be, for example, gold, silver, or the like. The TIM layer 51 may be formed of thermal grease, white grease, or the like. The TIM layer 51 may be formed by combining two or more of thermal grease, white grease, and the like.

The material of the TIM layer 51 may be any of an epoxy resin, silicone, an inorganic material, and a matrix polymer. The material of the TIM layer 51 may be a polymer mixed with a heat conductive filler. The matrix polymer may contain any selected from the group consisting of ethylene propylene, a monomer of ethylene propylene diene, and hydrogenated polyisoprene, and may be a combination of two or more selected from this group. The TIM layer 51 may contain any selected from the group consisting of aluminum oxide, boron nitride, and aluminum nitride, and may be a combination of two or more selected from this group.

The TIM layer 51 may contain any selected from the group consisting of carbon nanotubes, graphite, graphene, a polyimide resin, polybenzoxazole, an epoxy-based polymer, a silica-based polymer, and an acryl-based polymer, and may be a combination of two or more selected from this group. The TIM layer 51 may contain a filler. The thermal conductivity of the material of the TIM layer 51 may be equal to or greater than 5 W/(m·K) and equal to or less than 100 W/(m·K). Furthermore, the thermal conductivity of the material of the TIM layer 51 is preferably equal to or greater than 10 W/(m·K) and equal to or less than 90 W/(m·K). Furthermore, the thermal conductivity of the material of the TIM layer 51 is preferably equal to or greater than 20 W/(m·K) and equal to or less than 80 W/(m·K). The material of the TIM layer 51 may have a structure in which a polymer is bonded to a liquid metal by an organometallic bond, a coordinate bond, or a covalent bond.

The heat generated by the first component 24 is efficiently transferred to the second conductor member 36 by the TIM layer 51. As a result, the heat generated by the first component 24 disposed between the upper circuit board 12 and the lower circuit board 14 can be effectively suppressed from being transferred to the periphery of the first component 24.

The other structures of the circuit module 10g are the same as those of the circuit module 10, and thus description will be omitted. The circuit module 10g has the same functions and effects as those of the circuit module 10.

OTHER EMBODIMENTS

The circuit module according to the present disclosure is not limited to the circuit modules 10 and 10a to 10g, and can be changed within the scope of the gist thereof. The structures of the circuit modules 10 and 10a to 10g may be arbitrarily combined.

The number of lower circuit board second mounting electrodes 14c only needs to be 1 or more.

The number of components 22 only needs to be 1 or more.

The number of components 26 only needs to be 1 or more.

The number of components 28 only needs to be 1 or more.

The number of fifth conductor members 32 only needs to be 1 or more. The number of upper circuit board first mounting electrodes 12c only needs to be 1 or more. The number of lower circuit board fifth mounting electrodes 14e only needs to be 1 or more.

The number of fourth conductor members 40 only needs to be 1 or more. The number of lower circuit board fourth mounting electrodes 14g only needs to be 1 or more.

A shield member covering the front surface, the back surface, the left surface, the right surface, and the upper surface of the circuit modules 10 and 10a to 10g may be disposed.

The plurality of components 22, 26, and 28 are not essential components.

The third conductor member 38 is not an essential component.

The sealing resins 16, 18, and 20 are not essential components.

The second conductor member 36 may be disposed in the space between the upper circuit board 12 and the lower circuit board 14. In this case, the second conductor member 36 is not in contact with the upper circuit board body 12a.

The second conductor member 36 needs not to be in contact with the first component 24.

The first conductor member 34 may be two conductor members arranged along the up-down axis. The third conductor member 38 may be two conductor members arranged along the up-down axis.

The present disclosure includes the following structure.

(1) A circuit module including: an upper circuit board; a lower circuit board; a first conductor member; a second conductor member; and a first component, in which the upper circuit board includes an upper circuit board body, the lower circuit board includes a lower circuit board body, a lower circuit board first mounting electrode, and one or more lower circuit board second mounting electrodes, the upper circuit board body has a first upper main surface and a first lower main surface, the lower circuit board body has a second upper main surface and a second lower main surface, the lower circuit board first mounting electrode and the one or more lower circuit board second mounting electrodes are disposed on the second upper main surface, the first component is mounted on the one or more lower circuit board second mounting electrodes, the first conductor member is mounted on the lower circuit board first mounting electrode and is disposed on left of the first component, and the second conductor member is disposed in a space between the upper circuit board and the lower circuit board or on the first lower main surface, is connected to an upper end of the first conductor member, and overlaps at least a part of the first component as viewed in a downward direction.

(2) The circuit module according to (1) further including a third conductor member, in which the lower circuit board includes a lower circuit board third mounting electrode, the lower circuit board third mounting electrode is disposed on the second upper main surface, the third conductor member is mounted on the lower circuit board third mounting electrode, the third conductor member is disposed on right of the first component, and the second conductor member is connected to an upper end of the third conductor member.

(3) The circuit module according to (1) or (2), in which the second conductor member is disposed on the first lower main surface.

(4) The circuit module according to any of (1) to (3), further including a fourth conductor member, in which the lower circuit board further includes a lower circuit board fourth mounting electrode and an interlayer connection conductor, the interlayer connection conductor electrically connects the lower circuit board first mounting electrode and the lower circuit board fourth mounting electrode by penetrating the lower circuit board body along an up-down axis, and the fourth conductor member is mounted on the lower circuit board fourth mounting electrode.

(5) The circuit module according to (4) further including a fifth conductor member, in which the upper circuit board further includes an upper circuit board first mounting electrode, the lower circuit board further includes a lower circuit board fifth mounting electrode, the upper circuit board first mounting electrode is disposed on the first lower main surface, the lower circuit board fifth mounting electrode is disposed on the second upper main surface, the fifth conductor member is mounted on the upper circuit board first mounting electrode and the lower circuit board fifth mounting electrode, and an area of the fourth conductor member as viewed in a downward direction is larger than an area of the fifth conductor member as viewed in a downward direction.

(6) The circuit module according to any of (1) to (5), in which the second conductor member is in contact with the first component.

(7) The circuit module according to any of (1) to (6), in which thermal conductivity of the second conductor member is higher than thermal conductivity of the upper circuit board body.

(8) The circuit module according to any of (1) to (7) further including a fifth conductor member, in which the upper circuit board further includes an upper circuit board first mounting electrode, the lower circuit board further includes a lower circuit board fifth mounting electrode, the upper circuit board first mounting electrode is disposed on the first lower main surface, the lower circuit board fifth mounting electrode is disposed on the second upper main surface, and the fifth conductor member is mounted on the upper circuit board first mounting electrode and the lower circuit board fifth mounting electrode.

(9) The circuit module according to (8), in which an area of the first conductor member as viewed in a downward direction is larger than an area of the fifth conductor member as viewed in a downward direction.

(10) The circuit module according to any of (1) to (5) and (7) to (9) further including a thermal interface material (TIM) layer, in which the TIM layer is disposed between the first component and the second conductor member and is in contact with the first component and the second conductor member.

What is claimed is:

1. A circuit module comprising:
an upper circuit board;
a lower circuit board;
a first conductor member;
a second conductor member; and
a first component,
wherein
the upper circuit board includes an upper circuit board body,
the lower circuit board includes a lower circuit board body, a lower circuit board first mounting electrode, and one or more lower circuit board second mounting electrodes,
the upper circuit board body has a first upper main surface and a first lower main surface,
the lower circuit board body has a second upper main surface and a second lower main surface,
the lower circuit board first mounting electrode and the one or more lower circuit board second mounting electrodes are disposed on the second upper main surface,
the first component is mounted on the one or more lower circuit board second mounting electrodes,
the first conductor member is mounted on the lower circuit board first mounting electrode and is disposed on left of the first component, and
the second conductor member is disposed in a space between the upper circuit board and the lower circuit board or on the first lower main surface, is connected to an upper end of the first conductor member, and overlaps at least a part of the first component as viewed in a downward direction.

2. The circuit module according to claim 1, further comprising a third conductor member,
wherein
the lower circuit board includes a lower circuit board third mounting electrode,
the lower circuit board third mounting electrode is disposed on the second upper main surface,
the third conductor member is mounted on the lower circuit board third mounting electrode,
the third conductor member is disposed on right of the first component, and
the second conductor member is connected to an upper end of the third conductor member.

3. The circuit module according to claim 1, wherein the second conductor member is disposed on the first lower main surface.

4. The circuit module according to claim 1, further comprising a fourth conductor member,
wherein
the lower circuit board further includes a lower circuit board fourth mounting electrode and an interlayer connection conductor,
the interlayer connection conductor electrically connects the lower circuit board first mounting electrode and the lower circuit board fourth mounting electrode by penetrating the lower circuit board body along an up-down axis, and the fourth conductor member is mounted on the lower circuit board fourth mounting electrode.

5. The circuit module according to claim 4, further comprising a fifth conductor member, wherein the upper circuit board further includes an upper circuit board first mounting electrode, the lower circuit board further includes a lower circuit board fifth mounting electrode, the upper circuit board first mounting electrode is disposed on the first lower main surface, the lower circuit board fifth mounting electrode is disposed on the second upper main surface, the fifth conductor member is mounted on the upper circuit board first mounting electrode and the lower circuit board fifth mounting electrode, and an area of the fourth conductor member as viewed in the downward direction is larger than an area of the fifth conductor member as viewed in the downward direction.

6. The circuit module according to claim 1, wherein the second conductor member is in contact with the first component.

7. The circuit module according to claim 1, wherein a thermal conductivity of the second conductor member is higher than a thermal conductivity of the upper circuit board body.

8. The circuit module according to claim 1, further comprising a fifth conductor member, wherein the upper circuit board further includes an upper circuit board first mounting electrode, the lower circuit board further includes a lower circuit board fifth mounting electrode, the upper circuit board first mounting electrode is disposed on the first lower main surface, the lower circuit board fifth mounting electrode is disposed on the second upper main surface, and the fifth conductor member is mounted on the upper circuit board first mounting electrode and the lower circuit board fifth mounting electrode.

9. The circuit module according to claim 8, wherein an area of the first conductor member as viewed in the downward direction is larger than an area of the fifth conductor member as viewed in the downward direction.

10. The circuit module according to claim 1, further comprising a thermal interface material layer, wherein the thermal interface material layer is disposed between the first component and the second conductor member and is in contact with the first component and the second conductor member.

11. The circuit module according to claim 2, wherein the second conductor member is disposed on the first lower main surface.

12. The circuit module according to claim 2, further comprising a fourth conductor member, wherein the lower circuit board further includes a lower circuit board fourth mounting electrode and an interlayer connection conductor, the interlayer connection conductor electrically connects the lower circuit board first mounting electrode and the lower circuit board fourth mounting electrode by penetrating the lower circuit board body along an up-down axis, and the fourth conductor member is mounted on the lower circuit board fourth mounting electrode.

13. The circuit module according to claim 2, wherein the second conductor member is in contact with the first component.

14. The circuit module according to claim 2, wherein a thermal conductivity of the second conductor member is higher than a thermal conductivity of the upper circuit board body.

15. The circuit module according to claim 2, further comprising a fifth conductor member, wherein the upper circuit board further includes an upper circuit board first mounting electrode, the lower circuit board further includes a lower circuit board fifth mounting electrode, the upper circuit board first mounting electrode is disposed on the first lower main surface, the lower circuit board fifth mounting electrode is disposed on the second upper main surface, and the fifth conductor member is mounted on the upper circuit board first mounting electrode and the lower circuit board fifth mounting electrode.

16. The circuit module according to claim 2, further comprising a thermal interface material layer, wherein the thermal interface material layer is disposed between the first component and the second conductor member and is in contact with the first component and the second conductor member.

* * * * *